(12) United States Patent
Patil

(10) Patent No.: US 7,492,195 B1
(45) Date of Patent: Feb. 17, 2009

(54) AGILE, LOW PHASE NOISE CLOCK SYNTHESIZER AND JITTER ATTENUATOR

(75) Inventor: Gopal Patil, San Jose, CA (US)

(73) Assignee: Cypress Semiconductor Corp., San Jose, CA (US)

( * ) Notice: Subject to any disclaimer, the term of this patent is extended or adjusted under 35 U.S.C. 154(b) by 14 days.

(21) Appl. No.: 11/425,634

(22) Filed: Jun. 21, 2006

Related U.S. Application Data

(60) Provisional application No. 60/693,023, filed on Jun. 22, 2005.

(51) Int. Cl.
*H03L 7/06* (2006.01)
(52) U.S. Cl. ........................ 327/156; 327/147
(58) Field of Classification Search ............... None
See application file for complete search history.

(56) References Cited

U.S. PATENT DOCUMENTS

| | | | |
|---|---|---|---|
| 6,333,678 B1 * | 12/2001 | Brown et al. | 331/2 |
| 6,380,703 B1 * | 4/2002 | White | 318/254 |
| 6,933,794 B2 | 8/2005 | Ogiso | |
| 7,064,617 B2 * | 6/2006 | Hein et al. | 331/16 |
| 7,078,980 B2 * | 7/2006 | Muramatsu | 331/117 R |
| 2001/0028277 A1 * | 10/2001 | Northam | 331/34 |
| 2004/0022340 A1 | 2/2004 | Jaehne et al. | |
| 2004/0232995 A1 * | 11/2004 | Thomsen et al. | 331/2 |
| 2005/0077970 A1 * | 4/2005 | Da Dalt et al. | 331/16 |
| 2005/0088867 A1 * | 4/2005 | Iotov et al. | 365/45 |

OTHER PUBLICATIONS

U.S. Appl. No. 11/419,658 entitled Phase-Locked Loop, System, and Method That Utilizes Internal Feedback to Increase the Lock Range of the Phase-Locked Loop, filed May 22, 2006.
U.S. Appl. No. 10/947,519 entitled Frequency Synthesizer Having a More Versatile and Efficient Fractional-N Control Circuit and Method, filed Sep. 22, 2004.
De Muer et al., "A 1.8 GHz CMOS ΔΣ Fractional-N Synthesizer," EP Solid-State Circuits Conference, 2001, 4 pages.
Ahola et al., "A 2 GHz ΔΣ Fractional-N Frequency Synthesizer in 0.35 μm CMOS," EP Solid-State Circuits Conference, 2004, 4 pages.
Heuberger et al., "Integrated RF transmitter based on SAW Oscillator," 23rd EP Solid-State Circuits Conference, Sep. 1997, 4 pages.

\* cited by examiner

*Primary Examiner*—Cassandra Cox

(57) ABSTRACT

A phase locked loop circuit, system, and method of operation are provided. The phase-locked loop (PLL) includes a first PLL and a second PLL. The first PLL is nested inside the second PLL. According to one embodiment, the first PLL is coupled to the output of a surface acoustic wave (SAW) resonator, and includes first divider coupled within a feedback loop of the first PLL. The second PLL is coupled between an input of the overall PLL circuit, and output from the first PLL and the first divider. According to a second embodiment, the second PLL includes a SAW voltage-controlled oscillator (VCSO) and a second divider coupled to an output of the first PLL. Regardless of whether the first or second embodiments are contemplated, the nested first and second PLL circuits provide an agile, low phase noise, clock synthesizer and jitter attenuator hereof.

19 Claims, 4 Drawing Sheets

AGILE, LOW PHASE NOISE CLOCK SYNTHESIZER AND JITTER ATTENUATOR

PRIORITY CLAIM

This application claims priority to U.S. Provisional Application No. 60/693,023 filed Jun. 22, 2005.

BACKGROUND OF THE INVENTION

1. Field of the Invention

The present invention relates generally to electronic circuits and, more particularly, to a nested pair of phase-locked loop (PLL) circuits that are agile, in that multiple frequencies can be synthesized at the output, a low phase noise surface acoustic wave (SAW) resonator is used to synchronize the output and, with one of the PLL circuits being a low bandwidth PLL, jitter on the output is attenuated.

2. Description of the Related Art

The following descriptions and examples are not admitted to be prior art by virtue of their inclusion within this section.

In electronic circuits, clock distribution occurs throughout the circuit to synchronize performance of the product. Clock skew and jitter can occur if poor clock distribution is present. This may cause problems in operation of the electronic circuit. Techniques have been developed using PLL's to successfully manage these problems and reduce both to an acceptable level. However, the current solutions are not without some disadvantages.

A PLL can be used for clock distribution, clock multiplication, skew suppression, clock recovery, and other applications. A PLL can suppress skew and jitter in digital systems (for example, clock to data out delay), and can generate multiple phases of output clocks. In an exemplary application, a PLL may operate as a clock multiplier, where an input clock of 10 MHz may be multiplied by the PLL to yield, for example, 1000 MHz. Typically, a PLL includes a phase frequency detector, a charge pump, a low-pass filter, and a voltage-controlled oscillator (VCO). The phase frequency detector detects and tracks small differences in phase and frequency between the incoming signal and the output from the VCO, and provides output pulses that are proportional to that difference. In many instances, a PLL can include a frequency divider within the feedback loop between the VCO and the phase frequency detector. For example, an N divider allows the frequency output from the VCO to equal N times the input signal frequency, namely $F_{OUT}=N*F_{IN}$. In the ideal embodiment, clock multiplication function can result in an output clock that is in perfect phase alignment with the input clock, yet at a higher frequency (i.e., a frequency N times the input frequency).

Therefore, a PLL is oftentimes used as a clock synthesizer. In a 10 GHz XFP optical module, it may be necessary to translate one data/clock rate to another data/clock rate while keeping phase noise as small as possible on that output. The transfer can occur through clock multiplication and, possibly, clock division to achieve a particular ratio between an input and output frequency ($F_{IN}$ and $F_{OUT}$).

One mechanism in which to generate the output frequency with low phase noise is to utilize a SAW oscillator. As described in "Integrated RF transmitter based on SAW Oscillator," 23rd EP Solid-State Circuits Conference, September 1997 (herein incorporated by reference), SAW oscillators operate using a SAW resonator coupled to an output amplifier. The resonating frequency can be modified through an input voltage to form what is known as a voltage-controlled SAW oscillator, or VCSO. Further details of a VCSO are set forth in U.S. Pat. No. 6,933,794 (herein incorporated by reference).

A VCSO can be placed in a PLL by substituting a VSCO for the VCO. A primary benefit of a VCSO is that there is very little phase noise at the PLL output. This is due primarily to the VCSO having a high Q factor exceeding, for example, 10,000. Moreover, operation at the fundamental frequency of the resonator avoids any spurious emission on that output. Unfortunately, however, a VCSO has a very narrow pulling range. In other words, the VCSO, while having low phase noise and good jitter attenuation within a PLL, cannot be tuned much beyond 300 ppm.

Recognizing the shortcomings of a VCSO, some PLL circuits use the more traditional inductor/capacitor VCO, or LCVCO. An LCVCO, while having a higher phase noise and greater spurious emissions than a VCSO, can be tuned far beyond the 300 ppm of a VCSO. In some examples, an LCVCO can achieve a tuning range greater than 10%. The synthesized multiple rates associated with, for example, clock recovery in a 10 GHz XFP application, VCSO cannot be utilized because its incoming frequency variation can extend beyond the tuning range of the VCSO.

It would be desirable to implement a clock recovery or translation circuit that has low phase noise with good jitter attenuation of a VCSO within a PLL, yet with a wider range of tunability which conventional VCSO PLL circuits cannot achieve. Thus, a more agile, lower phase noise, clock synthesizer with jitter attenuation is desired.

SUMMARY OF THE INVENTION

The following description of various embodiments of systems, circuits and methods is not to be construed in any way as limiting the subject matter of the appended claims.

The problems outlined above are in large part solved by an improved circuit, system, and method hereof. The circuit or circuit architecture involves a nested pair of PLL circuits, with the first PLL circuit coupled to an output of a SAW resonator. A second PLL circuit is coupled to receive the input signal. The output of the second PLL circuit is coupled to a divider within the first PLL circuit feedback loop. The first PLL circuit is configured as a high bandwidth LCVCO PLL, and the second PLL circuit is configured as a low bandwidth, preferably digital, PLL.

The capacitor value within the LCVCO of the first PLL can be adjusted based on the control voltage input to the LCVCO. A modulator is coupled to receive the output from the low bandwidth second PLL, and places a modulated bitstream upon the divider within the first PLL. Therefore, the modulator and corresponding divider set a higher than normal bandwidth of the first PLL so that multiple input frequencies of the input signal submitted to the second PLL can be accepted, and corresponding outputs produced by the first PLL.

The second PLL can also comprise a digital filter and an adder coupled to the output of the digital filter. The digital filter has variable scaling coefficients, and the adder can add a bitstream from the digital filter to a gain control multiplier (or range control bit value). The gain control sets the range of the bitstream used to control the modulator within the first PLL. The coefficients of the digital filter can be set to a particular bandwidth, or filter range, to maintain the second PLL as a low bandwidth PLL. The combination of the range control bits and the modulator control the divide-by value of the divider within the feedback loop of the first PLL.

The first embodiment preferably includes simply a SAW resonator used to set the comparison frequency and phase of the first PLL. The SAW resonator frequency does not change in the first embodiment and, therefore, the SAW resonator does not encompass a VCSO since an input voltage will not be present, nor will the frequency of the SAW resonator be changed based on an input voltage.

In addition to the first embodiment, a second embodiment is provided where an input voltage is applied to set the resonant frequency of a SAW resonator within a VCSO. The second embodiment therefore utilizes a VCSO undergoing only slight changes on the input voltage to the VCSO so that the VCSO frequency output need not be significant pulled beyond what is typical of the SAW nominal resonating frequency. The input voltage is controlled through a low bandwidth PLL coupled to the output of a high bandwidth PLL. The output from the low bandwidth PLL is compared against the input frequency, and frequency difference is applied to the VCSO whose output is applied to the high bandwidth PLL. Similar to the first embodiment, the high bandwidth PLL comprises the first PLL, and the low bandwidth PLL comprises the second PLL, with the first PLL being nested inside the second PLL.

According to yet another embodiment, a method is provided for generating a clock signal. The method includes generating a periodic waveform from resonating interdigitized conductors arranged upon a substrate. A oscillating waveform generated from an inductor and capacitor is synchronized with the periodic waveform. A clock signal is adjusted relative to the synchronized periodic and oscillating waveforms by modulating a divider circuit. Synchronizing comprises determining a difference between the phase and/or frequency of the periodic waveform with the oscillating waveform, and modifying the phase and/or frequency of the oscillating waveform based on the difference. Modulating comprises changing a bitstream set of binary values forwarded to the divider circuit and therefore changing the divide-by value of the divider circuit. According to one example, generating the periodic waveform includes generating a surface acoustic wave signal from the interdigitized conductors.

BRIEF DESCRIPTION OF THE DRAWINGS

Other objects and advantages of the invention will become apparent upon reading the following detailed description and upon reference to the accompanying drawings in which.

Figure 1:
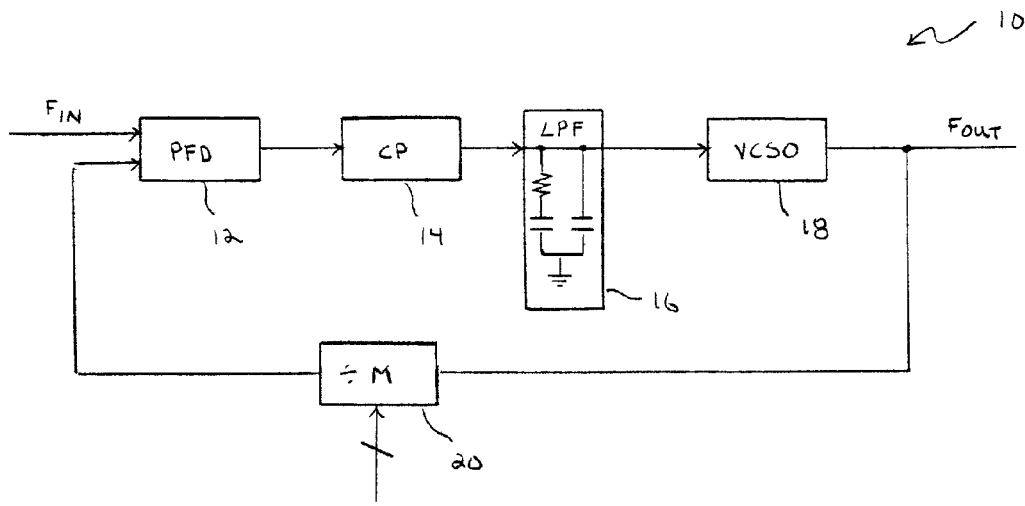
FIG. 1 is a block diagram of a PLL that utilizes a VCSO to lower phase noise and jitter.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF PREFERRED EMBODIMENTS

Turning now to the drawings, FIG. 1 illustrates one form of a PLL 10. PLL 10 includes a phase frequency detector 12, a charge pump 14, a filter 16, an oscillator 18, and a divider 20. Filter 16 can be a low-pass filter in that a cutoff frequency is established through a resistor-capacitor network. The cutoff frequency eliminates spurious noise and jitter which can occur at the higher bandwidth values. Divider 20 is any circuit which can divide an input frequency by a factor of M. The output frequency can therefore be a multiple of M times the input frequency, or $F_{OUT}=M*F_{IN}$. One form of such a divider can be a counter, for example. The count value is established through a set of bits placed into the counter to select, for example, one of several flip-flops within a series as the divide-by output. Phase detector 12 can come in many forms, one of the simplest forms is an exclusive-OR gate phase/frequency detector. Charge pump 14 provides an increasing of decreasing voltage output depending on the difference between phase and/or frequency at the input of detector 12. Oscillator 18 is any circuit which produces a periodic output controlled by the phase and/or frequency difference between $F_{IN}$ and the output of divider 20. In the example of FIG. 1, the oscillator is a voltage-controlled SAW oscillator or VCSO.

VCSO 18 can be formed in multiple ways. For example, an interdigitized transducer (IDT) can be arranged on the surface of a piezoelectric material, such as single crystal silicon, quartz, lithium niobate or lithium tantalate. The IDT uses two transducers for coupling energy into and out of the piezoelectric material, with one or more distributed reflector arrays to store energy. The distributed reflector array is typically composed of a series of shorted metal electrodes, etched grooves in the substrate, or dielectric strips. Each reflector can be a particular wavelength and width, and the periodicity of the array can also be of a particular wavelength. The resonant frequency output from the IDT is proportional to the energy placed into the IDT. As the input voltage changes, the output frequency changes.

There are multiple forms of VCSO designs in the marketplace. However, a commonality among most VCSO designs is they have very little spurious mode coupling problems, have low phase noise, and produce minimum jitter especially when placed within the loop of a PLL. Unfortunately, the resonant frequency cannot be tuned past a few hundred ppm. As a clock recovery circuit in which a clock is formed from an incoming signal and the incoming signal can vary significantly depending on the application, a VCSO proves unsuitable. Specifically, frequency modulation capability of a VCSO are simply too limited in most clock recovery applications.

Figure 2:
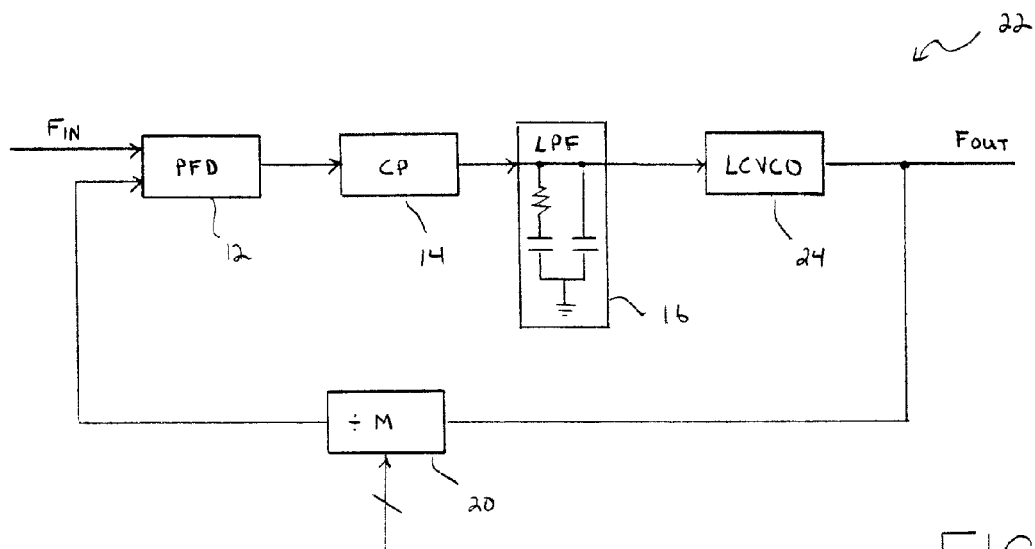
FIG. 2 is a block diagram of a PLL that utilizes an LCVCO to increase tuning range.

FIG. 2 illustrates an alternative PLL design 22. PLL 22 can be similar to PLL 10; therefore, certain elements are labeled the same as that shown in FIG. 1. In particular, detector 12, charge pump 14, filter 16, and divider 20 can be similar in FIGS. 1 and 2. However, instead of VCSO 18 (FIG. 1), FIG. 2 illustrates an inductor-capacitor voltage-controlled oscillator (LCVCO) 24. LCVCO 24 includes any oscillator whose output varies in proportion to a change in capacitance of the inductor-capacitor arrangement. The variable capacitor or varactor can be formed in multiple ways. For example, the varactor can be formed as a diode or multiple capacitors switchably coupled together to increase or decrease the overall capacitance value. As the voltage on the input increases, the capacitance value can possibly decrease thereby increasing the frequency of the overall resonating circuit. Further details of an exemplary LCVCO are described below.

Placing an LCVCO 24 within PLL 22 provides a wider tuning range than a VCSO. However, an LCVCO has a greater phase noise component than a VCSO. Moreover, an LCVCO produces more jitter than a VCSO at the same frequency. In order to attenuate the jitter, the LCVCO 24 bandwidth needs to be rather low (e.g., between 100 Hz and 100 KHz) resulting in higher noise dominated by the LCVCO.

In summary, a VCSO has low noise and low jitter, yet it cannot synthesize multiple frequencies and, therefore, is not sufficiently agile to handle the recovery of a clocking signal at multiple frequencies. Conversely, an LCVCO-based PLL is agile, but cannot attenuate jitter since the primary source of jitter would be downstream of the filter and thereby placed directly on the output from the LCVCO operating at higher phase noise and jitter. The solutions in FIGS. 1 and 2 are not optimal, a more preferred embodiment is set forth in FIG. 3.

Figure 3:
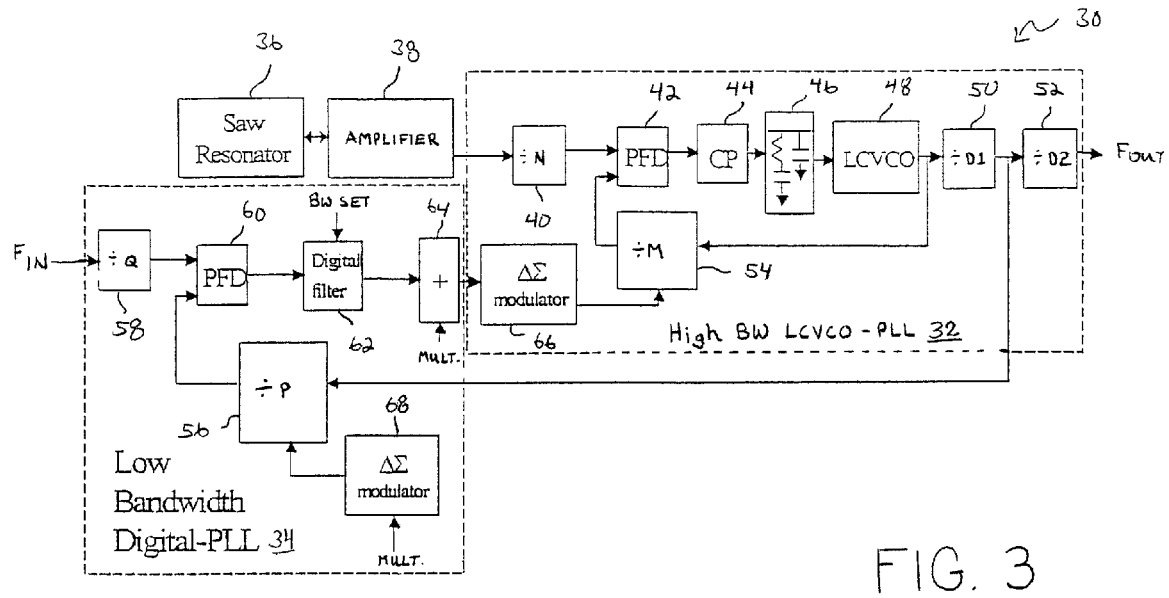
FIG. 3 is a block diagram of a preferred PLL that utilizes a SAW oscillator (SO) to lower phase noise and jitter on a reference periodic waveform used to synchronize an LCVCO output over a increased tuning range.

Referring to FIG. 3, a phase-locked loop 30 is shown. PLL 30 includes a first PLL 32 nested within a second PLL 34. The configuration of first PLL 32 and second PLL 34 improves jitter attenuation for translating one data/clock rate to another, yet keeps phase noise as low as that of a SAW oscillator. The improved configuration comprises a low noise, multi-rate, low bandwidth, jitter attenuator, and frequency synthesizer.

PLL 30 includes not only first PLL 32 and second PLL 34, but also a SAW resonator 36 coupled to the input of an amplifier 38. Amplifier 38 responds by applying stimulus back to resonator 36 to maintain the resonant frequency. The output from amplifier 38 is coupled to the input of the first PLL 32. The resonating frequency generated by the SAW resonator 36 provides a synchronization signal, possibly divided a factor N of divider 40 to the input of detector 42. Rather than placing the input signal into first PLL 32 and, specifically, on the input of detector 42, to which the feedback signal is compared, the input signal is applied to the second PLL 34.

First PLL 32 comprises a frequency divider 40 coupled to the output of amplifier 38, a phase/frequency detector 42 coupled to the output of divider 40, a charge pump 44 coupled to the output of detector 42, a filter 46 coupled to the output of charge pump 44, and an LCVCO 48 coupled to the output of filter 46. The output of LCVCO 48 can be coupled to a set of dividers 50 and 52, and can also be coupled to a divider 54. The output from divider 52 can be the output of PLL 32. The output of divider 50 is fed back to a divider 56 of the second PLL 34.

The second PLL 34 comprises a divider 58 having an output coupled to phase/frequency detector 60. The output of detector 60 is coupled to a digital filter 62, with adjustable bandwidth setting. The output of digital filter 62 is coupled to a summing node 64 that is summed with a range control value, the output of which is coupled to a modulator 66. The modulated output is coupled to divider 54. The second PLL 34 further comprises a desired multiplier value coupled to modulator 68, the output of which is coupled to divider 56. The input to the divider 56 is coupled to the output of the D1 divider 50. The output of divider 56 is coupled to the input of the phase/frequency detector 60 in the second PLL 34.

Figure 6:
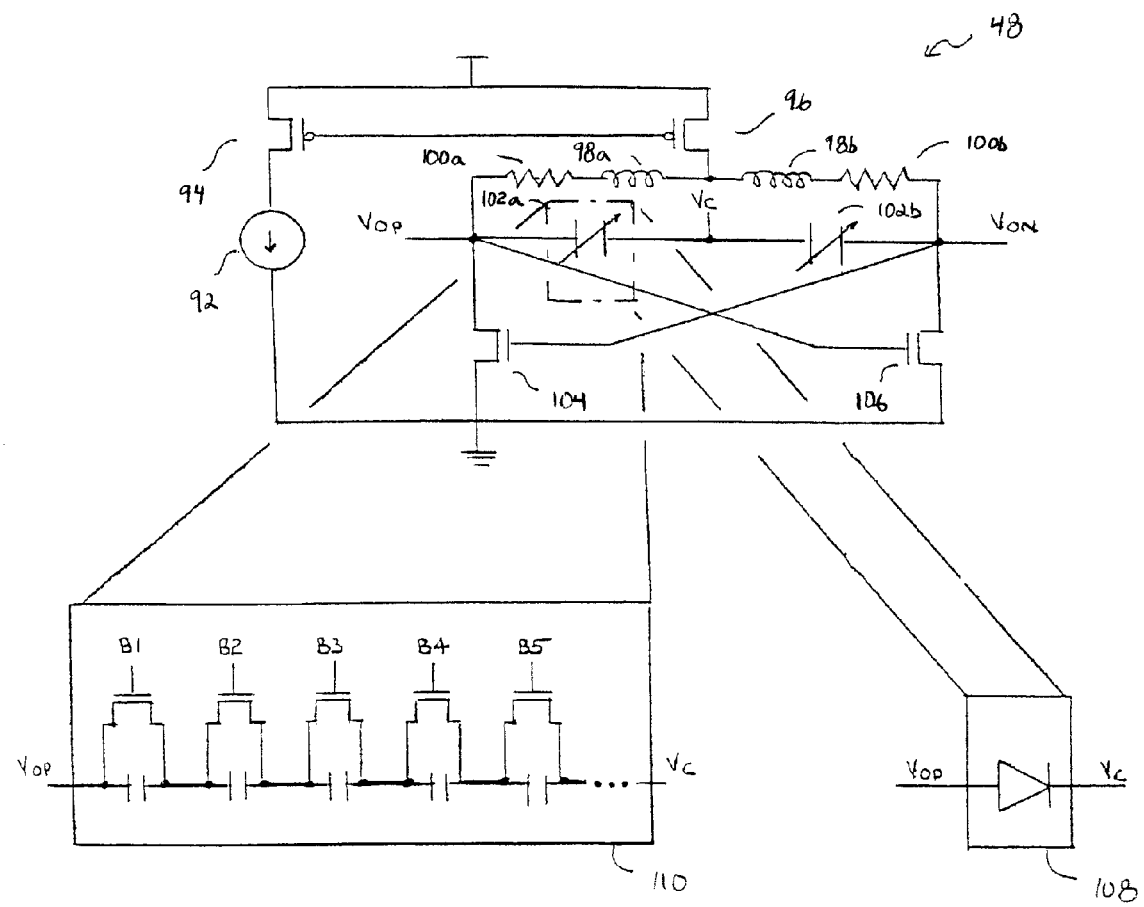
FIG. 6 is a circuit schematic of a LCVCO according to one example.
Figure 7:
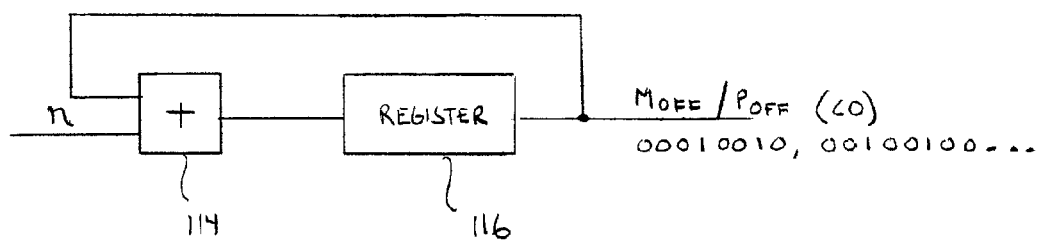
FIG. 7 is a block diagram of an accumulator or modulator circuit according to one example.
Figure 8:
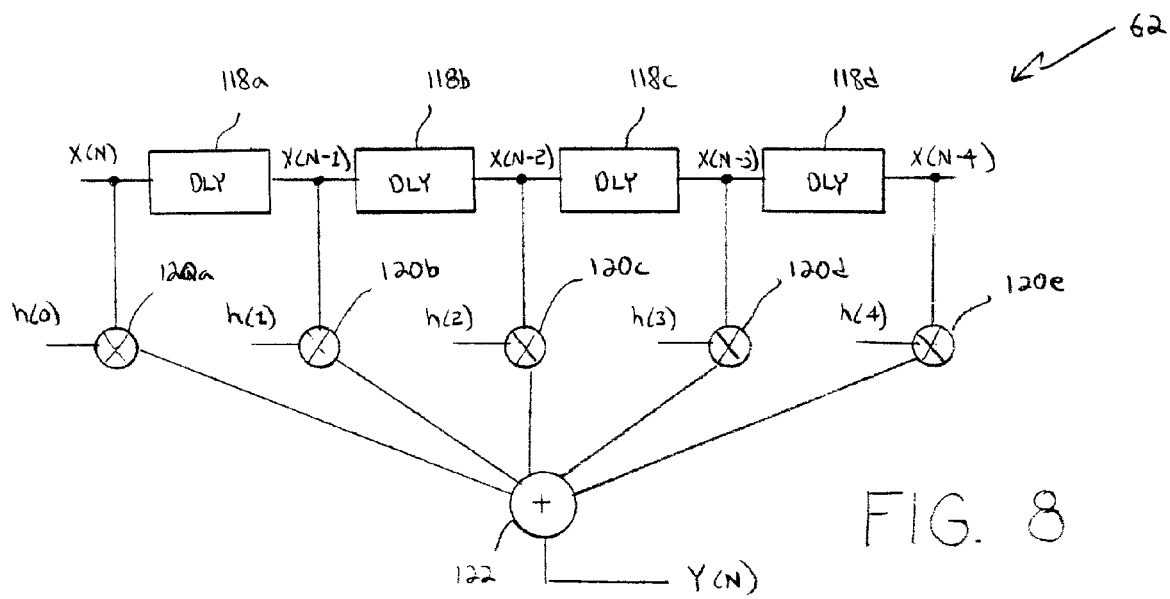
FIG. 8 is a block diagram of a digital filter according to one example.

The various forms of the blocks set forth in FIG. 3 are generally well-known as to their functionality, however, are coupled together to form an improved overall PLL system and method hereof. Further details of an LCVCO 48 are shown in FIG. 6, modulator 66 (such as a delta-sigma modulator) is shown in FIG. 7, and a digital filter 62 with bandwidth setting is shown in FIG. 8.

The PLL 30 avoids placing a VCSO within either the first or second PLL circuits 32 and 34, respectively, and thereby avoids the low tuning range of a VCSO. Conversely, the SAW resonator 36 and amplifier 38 are placed outside the loop and thereby set a low jitter reference point for detector 42 to which the output from a normally high jitter LCVCO 48 is synchronized via feedback divider 54. The divide-by factor of divider 54 is also controlled so that there is little jitter applied thereto since the second PLL 34 is a low bandwidth PLL controlled by the bandwidth setting of filter 62 and the range control variables controlled to adder 64 and modulator 68. In this fashion, divider 54 is controlled within a tight noise and jitter range, LCVCO output 48 is also controlled within a tight noise and jitter range via the reference oscillation of SAW resonator 36, and the combination of both produces a digitally-controlled SAW oscillator or DCSO. The digital control is through the low bandwidth digital PLL 34 used to synthesize the DCSO with a high bandwidth LCVCO PLL 32. The SAW oscillator 36 thereby dominates the close-in phase noise of the "simulated" DCSO. Pushing the bandwidth of the PLL 30 higher and running PLL 30 at higher frequency reduces phase noise at higher offsets.

In the improved solution shown in FIG. 3, the simulated DCSO is inserted into the low bandwidth digital PLL for jitter attenuation. With this improved architecture, frequency synthesis with accuracy of less than 1 ppm may be achieved. The improved architecture does not need a pullable or tunable SAW oscillator either placed in the PLL or otherwise, thereby making the design of the SAW oscillator 36 significantly easier.

The improved architecture of FIG. 3 includes a SAW oscillator and a high bandwidth LCVCO PLL nested inside a low bandwidth digital PLL. The function of the low bandwidth digital PLL 34 is to attenuate the reference input jitter of the input signal applied to detector 60. The high bandwidth LCVCO PLL 32 follows PLL 34 to perform frequency translation for a wide range of input frequencies of the input signal $F_{IN}$.

SAW resonator 36 and amplifier 38 provide a low noise reference which PLL 32 translates to the output frequency $F_{OUT}$. PLL 34 controls the multiplier ratio of the PLL 32 to lock the output frequency to the desired multiplier ratio of the input frequency. According to one example, PLL 30 takes any frequency between, for example, 622-705 MHz and outputs any frequency between 622-705 MHz, with phase noise similar a SAW oscillator phase noise having a Q factor exceeding 10,000. The input frequency $F_{IN}$ and the output frequency $F_{OUT}$ can differ from one another or be the same. However, the improved architecture can easily be generalized for other frequency ranges. PLL 30 does not involve a pullable SAW oscillator and can satisfy the current XFP requirements and can synthesize any frequency from any other frequency with less than 1 ppm accuracy.

Figure 4:
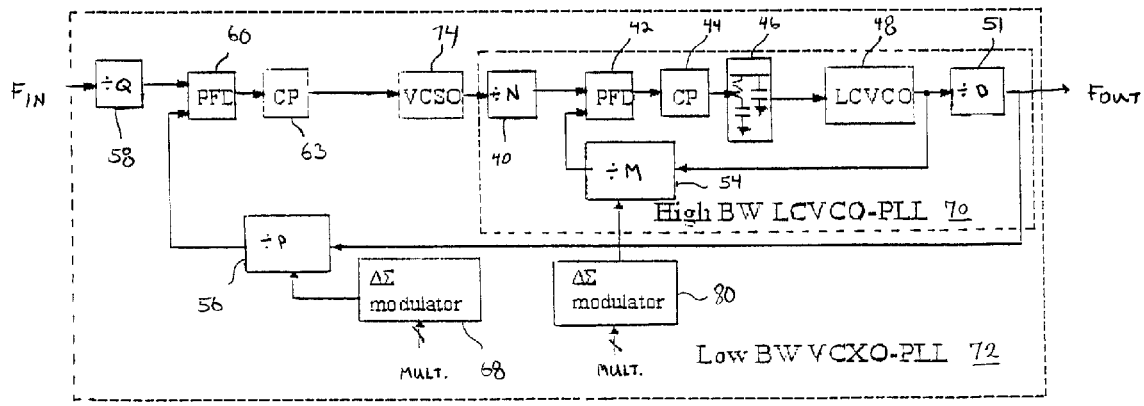
FIG. 4 is a block diagram of another preferred PLL that utilizes a VCSO to establish a reference periodic waveform that is variable based on an output from a LCVCO.

FIG. 4 illustrates an alternative embodiment in which jitter attenuation is performed using an analog PLL rather than a digital PLL. Thus, instead of nesting a first PLL 32 within a second PLL 34 being a digital PLL, the configuration of FIG. 4 nests a first PLL 70 within a second PLL 72 being an analog PLL. A VCSO 74 can be used in the second PLL 72, with a pulling range sufficient to cover the frequency tolerances of the input frequency $F_{IN}$. The various blocks of the first PLL 70 that are similar to PLL 32 are labeled the same. Instead of two dividers 50 and 52, only a single divider 51 can be used or possibly no dividers at the output of LCVCO 48. Divider 51 only provides additional flexibility in the output $F_{OUT}$ frequency if needed. It is preferred at least one divider be present at the output.

Instead of setting the divide-by factor M in divider 54 from the output of a filtered and range-controlled phase/frequency detector (FIG. 3), divider 54 in FIG. 4 is controlled through multiplier bits applied to a modulator 80. Therefore, the selectivity of the divide-by factor is set at whatever the value of the multiplier bits input to modulator 80, somewhat similar to the multiplier bits that can be applied to the adder 64 in FIG. 3. The remaining blocks of second PLL 72 that are similar to PLL 34 have been labeled the same, with a charge pump 63 also provided.

Figure 5:
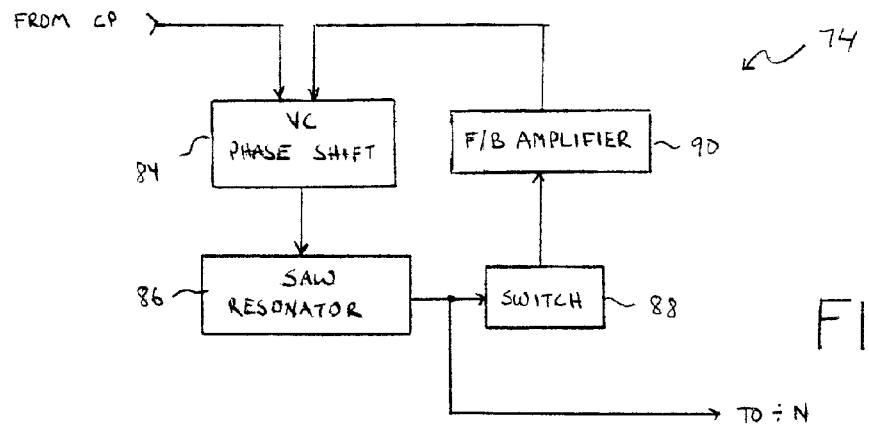
FIG. 5 is a block diagram of a VCSO according to one example.

FIG. 5 illustrates one example of VCSO 74 (FIG. 4). VCSO 74 can receive an input voltage from, for example, charge pump 63 into a voltage-controlled phase shift circuit 84. Circuit 84 adjusts the phase of the input signal by shifting it by a predetermined amount based on the external voltage applied thereto. The phase shift sent from circuit 84 is fed into the IDT of SAW resonator 86 to adjust the predetermined resonant frequency of the IDT output. A switch 88 and feedback amplifier 90 receive the resonating frequency from resonator 86 and feed back the signal to circuit 84 for updating the resonant frequency based on the difference between the incoming voltage and the feedback voltage at the input of circuit 84. For example, switch 88 can be used to select another IDT among a plurality of IDT's, each having a unique resonating frequency. The switchably selected IDT produces a resonating frequency that is converted to a voltage and compared to the incoming voltage for any differences. Once the differences are below a predetermined amount, the appropriate IDT is selected and the output is applied to, for example, the divide-by N divider 40 (FIG. 4).

Turning to FIG. 6, one example of an LCVCO 48 (FIGS. 3-4) is shown. LCVCO 48 may include an input $V_C$ and possibly differential outputs $V_{OP}$ and $V_{ON}$. If needed, the outputs can be arranged so that they are single-ended. A bias current can be generated by a current source 92 that is mirrored from transistor 94 to transistor 96. The mirrored current then activates a resonator network that includes an inductor 98, resistor 100, and variable capacitor 102. The frequency produced on the differential outputs are proportional to the voltage placed on $V_C$ and, depending on the arrangement of the variable capacitor, upon bits placed into a capacitor array that forms the variable capacitor 102. A cross-coupled pair of transistors 104/106 toggle the differential outputs and produces a differential amplification to those outputs.

Shown in detail, variable capacitor 102 can be a voltage-variable capacitor or varactor 108. Preferably, varactor 108 can be formed as a diode junction and as a simple reverse-biased diode. The capacitance PN junction decreases with increased reverse voltage. Thus, as $V_C$ increases, the capacitance of varactor 108 decreases, thereby increasing the resonating frequency of the resonators quasi-latched by the cross-coupled transistors 104/106. Alternatively, the capacitance can be modified by a sequence of bits B1-5, coupled across a series of capacitors 110. The capacitors are shown coupled in series and as the number of bits increases, the total capacitance value will decrease. However, conversely, the capacitors can be coupled in parallel with the total number of bit values increased to increase the overall capacitance value.

FIG. 7 illustrates a modulator 112 that can be used as any of the modulators 66, 68, or 80 (FIGS. 3-4). Specifically, modulator 112 can be a delta-sigma modulator such as those illustrated in, for example, "A 2 GHz ΔΣ Fractional-N Frequency Synthesizer in 0.35 µm CMOS," EP Solid-State Circuits Conference, 2000, and "A 1.8 GHz CMOS ΔΣ Fractional-N Synthesizer," EP Solid-State Circuits Conference, 2001 (herein incorporated by reference). Modulator 112 can be configured with, for example, an adder 114 and a storage device, such as a register 116. The combination of adder 114 and register 116 forms an accumulator. The accumulator produces a binary bit sequence to establish an offset value $M_{OFF}/P_{OFF}$. The offset value can be the carryout function of the adder if necessary. The carryout value is sent to the divider to establish a divide-by factor. The offset value can change by a vector amount to establish any change in the divide-by amount P. The change can formulate a fractional divider if necessary. Details of an accumulator and the mode control of the offset $M_{OFF}/P_{OFF}$ used to control the divider prescalar unit are known to those skilled in the art in a delta-sigma modulator mechanism having the benefit of this disclosure.

FIG. 8 illustrates an example of digital filter 62 (FIG. 3). Filter 62 may have multiple tap elements, and in the example shown, five tap elements are shown to produce, for example, a finite impulse response (FIR) filter structure, with a delay element 118 between each tap. More (or less) than five taps can be used, depending on the amount of needed smoothing of the filter cutoff. Each tap element includes a mixer circuit 120. A coefficient h can be mixed with the tap value. Each mixer 120 multiplies the constant coefficients h by the signal sample, and the result is summed by a summing node 122 to produce a filtered output. That output can be sent into the adder 64 of FIG. 3, for example.

It will be appreciated to those skilled in the art having the benefit of this disclosure that this invention is believed to provide an agile, low phase noise, clock synthesizer and jitter attenuator. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A phase-locked loop circuit, comprising:
  a surface acoustic wave (SAW) resonator;
  a first phase-locked loop circuit coupled to an output of the SAW resonator and having a first divider coupled within a feedback loop of the first phase-locked loop circuit; and
  a second phase-locked loop circuit coupled between an input to the phase-locked loop circuit, an output from the first phase-locked loop circuit, and the first divider, wherein the second phase-locked loop circuit comprises a second divider coupled to receive the output from the first phase-locked loop and an output from a modulator configured to produce a bit stream that sets a divide-by value of the second divider.

2. The phase-locked loop circuit as recited in claim 1, wherein the first phase-locked loop circuit comprises an inductor-capacitor voltage controlled oscillator (LCVCO) whose output is coupled to the first divider.

3. The phase-locked loop circuit as recited in claim 2, wherein the LCVCO comprises a variable capacitor or varactor.

4. The phase-locked loop circuit as recited in claim 1, wherein the modulator comprises an accumulator.

5. The phase-locked loop circuit as recited in claim 1, wherein the modulator comprises a delta-sigma modulator.

6. The phase-locked loop circuit as recited in claim 1, wherein the first phase-locked loop circuit comprises a high bandwidth phase-locked loop.

7. The phase-locked loop circuit as recited in claim 1, wherein the second phase-locked loop circuit comprises a low bandwidth digital phase-locked loop.

8. The phase-locked loop circuit as recited in claim 1, wherein the second phase-locked loop circuit comprises a digital filter whose scaling coefficients are variable and further comprises an adder that adds a bitstream from the digital filter to a gain control multiplier set of bit values and whereby an output of the adder is coupled to a modulated input of the first divider for controlling the divide-by value of the first divider.

9. A phase-locked loop circuit, comprising:
a first phase-locked loop circuit having an inductor-capacitor voltage controlled oscillator (LCVCO); and
a second phase-locked loop having a surface acoustic wave (SAW) voltage controlled oscillator (VCSO) and a second divider coupled to an output of the LCVCO.

10. The phase-locked loop circuit as recited in claim 9, wherein the output of the LCVCO is an output of the phase-locked loop.

11. The phase-locked loop circuit as recited in claim 9, wherein the second phase-locked loop comprises a phase-frequency detector coupled to receive an input to the phase-locked loop and an output from the second divider.

12. The phase-locked loop circuit as recited in claim 9, wherein the first phase-locked loop is configured to receive an output from the VCSO.

13. A method for generating a clock signal, comprising:
generating a periodic waveform from resonating interdigitized conductors arranged upon a substrate, wherein said generating comprises amplifying a resonate frequency of the interdigitized conductors;
synchronizing an oscillating waveform generated from an inductor and capacitor with the periodic waveform; and
adjusting the clock signal relative to the synchronized periodic and oscillating waveforms by modulating a divider circuit.

14. The method as recited in claim 13, wherein said synchronizing comprises determining a difference between the phase and/or frequency of the periodic waveform with the oscillating waveform and modifying the phase and/or frequency of the oscillating waveform based on the difference.

15. The method as recited in claim 13, wherein said modulating comprises changing a bitstream set of binary values forwarded to the divider circuit by correspondingly changing the divide-by value of the divider circuit.

16. The method as recited in claim 13, wherein said synchronizing comprises filtering the phase and/or frequency difference between an input signal and a frequency divided oscillating waveform and applying a scaled said filtered difference to a divider for changing the phase and/or frequency of the oscillating waveform to match the periodic waveform.

17. A method for generating a clock signal, comprising:
generating a periodic waveform from resonating interdigitized conductors arranged upon a substrate;
synchronizing an oscillating waveform generated from an inductor and capacitor with the periodic waveform;
adjusting the clock signal relative to the synchronized periodic and oscillating waveforms by modulating a divider circuit;
wherein said synchronizing comprises determining a difference between the phase and/or frequency of the periodic waveform with the oscillating waveform and modifying the phase and/or frequency of the oscillating waveform based on the difference; and
wherein said generating comprises shifting a phase of a signal applied to a surface acoustic wave resonator based on the difference.

18. The method as recited in claim 17, wherein said synchronizing comprises modifying the generated waveform by changing a voltage applied to a variable capacitor.

19. The method as recited in claim 17, wherein said modulating comprises changing a bitstream set of binary values forwarded to the divider circuit by correspondingly changing the divide-by value of the divider circuit.

* * * * *